(12) United States Patent  
Nakamura et al.

(10) Patent No.: US 8,043,798 A0
(45) Date of Patent: Oct. 25, 2011

(54) METHOD OF FORMING FINE PATTERNS

(75) Inventors: Tsuyoshi Nakamura, Kanagawa-ken (JP); Tasuku Matsumiya, Kanagawa-ken (JP); Kiyoshi Ishikawa, Kanagawa-ken (JP); Yoshiki Sugeta, Kanagawa-ken (JP); Toshikazu Tachikawa, Kanagawa-ken (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 176 days.

(21) Appl. No.: 10/644,738

(22) Filed: Aug. 21, 2003

(65) Prior Publication Data
US 2004/0104196 A1   Jun. 3, 2004

(30) Foreign Application Priority Data

Aug. 21, 2002   (JP) .................. 2002-241108

(51) Int. Cl.
G03C 5/00   (2006.01)
(52) U.S. Cl. ........ 430/324; 430/296; 430/315; 430/322; 430/330; 430/942; 427/271; 427/372.2; 427/384; 427/385.5; 438/760
(58) Field of Classification Search .................. 430/296, 430/273.1, 313, 315, 322, 324, 330, 942; 427/271, 384, 372.2, 385.5; 438/760
See application file for complete search history.

(56) References Cited

U.S. PATENT DOCUMENTS 6,486,058 B1 * 11/2002 Chun ........................ 438/637

FOREIGN PATENT DOCUMENTS

| JP | 64-023535 | 1/1989 |
|----|-----------|--------|
| JP | 01-307228 | 12/1989 |
| JP | 04-364021 | 12/1992 |
| JP | 05-166717 | 7/1993 |
| JP | 05-241348 | 9/1993 |
| JP | 07-045510 | 2/1995 |
| JP | 10-073927 | 3/1998 |
| JP | 11-153857 | 6/1999 |
| JP | 11-204399 | 7/1999 |
| JP | 11-283910 | 10/1999 |
| JP | 2000-347414 | 12/2000 |
| JP | 2002-023389 | 1/2002 |
| JP | 2002-148809 | 5/2002 |
| TW | 567533 | 12/2003 |

OTHER PUBLICATIONS

"Extended Abstracts" (The 42nd Spring Meeting, 1996); The Japan Society of Applied Physics and Related Societies, No. 2.
"Extended Abstracts" (The 55th Autumn Meeting, 1994); The Japan Society of Applied Physics, No. 2.
"Proc. SPIE", vol. 4345, pp. 647-654.
T. Kijima et al., "Low Temperature Deposition of $Bi_4Ti_3O_{12}$ Thin Films by MOCVD", Functional Devices Lab. Sharp Corp., with "Concise Explanation of the Relevance with Respect to Extended Abstracts (The 42nd Spring Meeting, 1995); The Japan Society of Applied Physics and Related Societies", 29p-D-2.
H. Watanabe et al., "Development of Y1 Materials (Bi Layer Structured Ferroelectrics) Thin-Film Capacitors (II)", Olympus Optical Co., Ltd. *Symetrix Co., with "Concise Explanation of the Relevance with Respect to Extended Abstracts (The 55th Autumn Meeting, 1994); The Japan Society of Applied Physics", 20p-M-19.
Jun-Sung Chun et al., "Toward 0.1 µm Contact Hole Process by Using Water Soluble Organic Over-Coating Material (WASOOM); Resist Flow Technique (III); Study on WASOOM, Top Flare and Etch Characterization", Advances in Resist Technology and Processing XVIII, Proceedings of SPIE, vol. 4345 (2001), pp. 647-654.
S. Satoh et al., "Electrical Properties of $Bi_4Ti_3O_{12}$ Thin Films by MOCVD", Functional Devices Lab. Sharp Corp., with "Concise Explanation of the Relevance with Respect to Extended Abstracts (The 42nd Spring Meeting, 1995); The Japan Society of Applied Physics and Related Societies", 29p-D-3.

* cited by examiner

Primary Examiner — Christopher Young
(74) Attorney, Agent, or Firm — Wenderoth, Lind & Ponack, L.L.P.

(57) ABSTRACT

It is disclosed a method of forming fine patterns comprising: covering a substrate having photoresist patterns thereon made of a photoresist composition which is sensitive to high energy light rays with wavelength of 200 nm or shorter or electron beam radiation, with an over-coating agent for forming fine patterns, applying heat treatment to cause thermal shrinkage of the over-coating agent so that the spacing between adjacent photoresist patterns is lessened by the resulting thermal shrinking action, and removing the over-coating agent substantially completely. The present invention provides a method of forming fine patterns whereby fine patterns having pattern width or diameter of 100 nm or shorter and being excellent in uniformity (in-plane uniformity), etc. can be formed by ultrafine processing using high energy light rays with wavelength of 200 nm or shorter or electron beams.

7 Claims, No Drawings

METHOD OF FORMING FINE PATTERNS

BACKGROUND OF THE INVETNION

1. Field of the Invention

This invention relates to a method of forming fine patterns in the field of photolithographic technology. More particularly, the invention relates to a method of forming or defining fine patterns, such as hole patterns and trench patterns, that can meet today's requirements for higher packing densities and smaller sizes of semiconductor devices.

2. Description of the Related Art

In the manufacture of electronic components such as semiconductor devices and liquid-crystal devices, there is employed the photolithographic technology which, in order to perform a treatment such as etching on the substrate, first forms a film (photoresist layer) over the substrate using a so-called radiation-sensitive photoresist which is sensitive to activating radiations, then performs exposure of the film by selective illumination with an activating radiation, performs development to dissolve away the photoresist layer selectively to form an image pattern (photoresist pattern), and forms a variety of patterns including contact providing patterns such as a hole pattern and a trench pattern using the photoresist pattern as a protective layer (mask pattern).

With the recent increase in the need for higher packing densities and smaller sizes of semiconductor devices, there is a growing demand for still finer patterns. Following the current tendency, use is made of short-wavelength radiations such as KrF, ArF and $F_2$ excimer laser beams and electron beams (EB) as the activating light necessary in the formation of mask patterns. Further, active R&D efforts are being made to find photoresist materials as mask pattern formers that have physical properties adapted to those short-wavelength radiations.

In recent years, particular attempts have been vigorously made to develop ultrafine processing techniques with the use of high-energy light rays having wavelength of 200 nm or shorter (for example, ArF or $F_2$ excimer laser beams) or electron beams and it is an important problem to be solved to form finer and more precise photoresist patterns using such photoresist materials adapted to ultrashort-wavelength radiations.

Existing pattern formation methods with the use of these photoresist materials adapted to ultrashort-wavelength radiations are typified by a method which comprises coating such a photoresist composition adapted to ultrashort-wavelength radiations on a silicon wafer, drying to form a photoresist layer, irradiating the photoresist layer selectively with high energy light rays having wavelength of 200 nm or shorter or electron beams, and then developing with an alkaline developer to thereby form patterns.

By the existing method as described above, however, it is very difficult to form fine patterns having pattern width or diameter of 100 nm or less. Even though such fine patterns as having pattern width or diameter of 100 nm or less can be formed, the obtained fine patterns frequently suffer from variations in the pattern dimensions and thus have troubles in uniformity (in-plane uniformity), etc. Accordingly, these patterns are unsuitable in practice for the production of semiconductors in most cases.

JP 2001-281886A discloses a method comprising the steps of covering a surface of a resist pattern with an acidic film made of a resist pattern size reducing material containing a water-soluble resin, rendering the surface layer of the resist pattern alkali-soluble, then removing said surface layer and the acidic film with an alkaline solution to reduce the feature size of the resist pattern. JP-2002-184673A discloses a method comprising the steps of forming a resist pattern on a substrate, then forming a film containing a water-soluble film forming component on said resist pattern, heat treating said resist pattern and film, and immersing the assembly in an aqueous solution of tetramethylammonium hydroxide, thereby forming a fine-line resist pattern without involving a dry etching step. However, both methods are simply directed to reducing the size of resist trace patterns themselves and therefore are totally different from the present invention in object.

SUMMARY OF THE INVENTION

The present invention, which has been completed under the above-described circumstances, aims at providing a method of forming fine patterns whereby fine patterns having pattern width or diameter of 100 nm or less and being excellent in uniformity (in-plane uniformity), etc. can be formed by ultrafine processing using high energy light rays having wavelength of 200 nm or shorter or electron beams.

In order to attain this object, the present invention provides a method of forming fine patterns comprising: covering a substrate having photoresist patterns thereon made of a photoresist composition which is sensitive to high energy light rays having wavelength of 200 nm or shorter or electron beam radiation, with an over-coating agent for forming fine patterns, applying heat treatment to cause thermal shrinkage of the over-coating agent so that the spacing between adjacent photoresist patterns is lessened by the resulting thermal shrinking action, and removing the over-coating agent substantially completely.

In a preferred embodiment, the heat treatment is performed at a temperature that does not cause thermal fluidizing of the photoresist patterns on the substrate.

DETAILED DESCRIPTION OF THE INVENTION

The present invention is described below in greater detail.

As a photoresist composition to be used as a photoresist pattern former in the present invention, use is made of a composition sensitive to high energy light rays having wavelength of 200 nm or shorter (ArF and $F_2$ excimer lasers, etc.) or electron beams.

As such a photoresist composition, it is preferable to use a photoresist composition of chemically amplifiable type which contains an acid generator that generates an acid when exposed to light or subjected to electron beam photolithography. For example, citation may be made of a positive-working photoresist of chemically amplifiable type which contains a polymer having at least a polyhydroxystyrene unit and a (meth)acrylate unit having a tertiary-alkyl esterified protecting group and an acid generator, and a positive-working photoresist of chemically amplifiable type which contains as its constitutional unit a polymer having a (meth)acrylate unit having at least one polycyclic hydrocarbon group in a side chain and showing an elevated solubility in an alkali under an action of an acid and an acid generator, though it is not restricted to these compositions.

The substrate having photoresist patterns thereon to be used in the present invention can be prepared by any methods conventionally employed in the fabrication of semiconductor devices without particular limitation. For example, a photoresist composition sensitive to the high energy light rays having wavelength of 200 nm or shorter or electron beams as described above is coated on a substrate such as a silicon wafer with a spinner or the like and dried to form a photoresist layer, which is then illuminated with an activating radiation such as excimer laser beams through a desired mask pattern using a reduction-projection exposure system or subjected to electron beam photolithography, then heated and developed with a developer such as an alkaline aqueous solution, typically a 1 to 10 mass % aqueous tetramethylammonium hydroxide (TMAH) solution, thereby forming photoresist patterns on the substrate.

In the conventional methods of forming patterns with the use of short wavelength activating radiations having wavelength of 200 nm or shorter or electron beams, patterns having width or diameter of 100 nm or less can be hardly formed in this step. The method according to the present invention further involves the following steps. Owing to these subsequent steps, ultrafine patterns of 100 nm or less can be formed or defined by the method of the invention while sustaining excellent in-plane uniformity.

[a.] Over-Coating Agent Application Step

Next, an over-coating agent is applied to cover entirely the said substrate having photoresist patterns (mask patterns) thereon. After applying the over-coating agent, the substrate may optionally be pre-baked at a temperature of 80–100° C. for 30–90 seconds.

The over-coating agent may be applied by any methods commonly employed in the conventional heat flow process. Specifically, an aqueous solution of the over-coating agent for forming fine patterns is applied to the substrate by any known application methods including bar coating, roll coating and whirl coating with a spinner.

The over-coating agent employed in the invention is to cover entirely the substrate having photoresist patterns (mask patterns) thereon, including patterns typified by hole patterns or trench patterns, each of these patterns are defined by spacing between adjacent photoresist patterns (mask patterns). Upon heating, the applied film of over-coating agent shrinks to increase the width of each of the photoresist patterns, thereby narrowing or lessening adjacent hole patterns or trench patterns as defined by spacing between the photoresist patterns and, thereafter, the applied film is removed substantially completely to form or define fine featured patterns.

The phrase "removing the applied film substantially completely" as used herein means that after lessening the spacing between adjacent photoresist patterns by the heat shrinking action of the applied over-coating agent, said film is removed in such a way that no significant thickness of the over-coating agent will remain at the interface with the photoresist patterns. Therefore, the present invention does not include methods in which a certain thickness of the over-coating agent is left intact near the interface with the photoresist pattern so that the feature size of the pattern is reduced by an amount corresponding to the residual thickness of the over-coating agent.

In the present invention, the over-coating agent is preferably employed that contains a water-soluble polymer.

The water-soluble polymer may be any polymer that can dissolve in water at room temperature and various types may be employed without particular limitation; preferred examples include acrylic polymers, vinyl polymers, cellulosic derivatives, alkylene glycol polymers, urea polymers, melamine polymers, epoxy polymers and amide polymers.

Exemplary acrylic polymers include polymers and copolymers having monomeric components, such as acrylic acid, methyl acrylate, methacrylic acid, methyl methacrylate, N,N-dimethylacrylamide, N,N-dimethylaminopropylmethacrylamide, N,N-dimethylaminopropylacrylamide, N-methylacrylamide, diacetone acrylamide, N,N-dimethylaminoethyl methacrylate, N,N-diethylaminoethyl methacrylate, N,N-dimethylaminoethyl acrylate, acryloylmorpholine, etc.

Exemplary vinyl polymers include polymers and copolymers having monomeric components, such as N-vinylpyrrolidone, vinyl imidazolidinone, vinyl acetate, etc.

Exemplary cellulosic derivatives include hydroxypropylmethyl cellulose phthalate, hydroxypropylmethyl cellulose acetate phthalate, hydroxypropylmethyl cellulose hexahydrophthalate, hydroxypropylmethyl cellulose acetate succinate, hydroxypropylmethyl cellulose, hydroxypropyl cellulose, hydroxyethyl cellulose, cellulose acetate hexahydrophthalate, carboxymethyl cellulose, ethyl cellulose, methylcellulose, etc.

Exemplary alkylene glycol polymers include addition polymers and copolymers of ethylene glycol, propylene glycol, etc.

Exemplary urea polymers include those having methylolurea, dimethylolurea, ethyleneurea, etc. as components.

Exemplary melamine polymers include those having methoxymethylated melamine, methoxymethylated isobutoxymethylated melamine, methoxyethylated melamine, etc. as components.

Among epoxy polymers and amide polymers, those which are water-soluble may also be employed.

It is particularly preferred to employ at least one member selected from the group consisting of alkylene glycol polymers, cellulosic derivatives, vinyl polymers and acrylic polymers. Acrylic polymers are most preferred since they provide ease in pH adjustment. Copolymers comprising acrylic polymers and water-soluble polymers other than acrylic polymers are also preferred since during heat treatment, the efficiency of shrinking the spacing between adjacent photoresist patterns (mask patterns) can be increased while maintaining the shape of the photoresist pattern. The water-soluble polymers can be employed either singly or in combination.

When water-soluble polymers are used as copolymers, the proportions of the components are not limited to any particular values. However, if stability over time is important, the proportion of the acrylic polymer is preferably adjusted to be larger than those of other building polymers. Other than by using excessive amounts of the acrylic polymer, better stability over time can also be obtained by adding acidic compounds such as p-toluenesulfonic acid and dodecylbenzenesulfonic acid.

The over-coating agent for forming fine patterns may additionally contain water-soluble amines. Preferred ones include amines having pKa (acid dissociation constant) values of 7.5–13 in aqueous solution at 25° C. in view of the prevention of the generation of impurities and pH adjustment. Specific examples include the following: alkanolamines, such as monoethanolamine, diethanolamine, triethanolamine, 2-(2-aminoethoxy)ethanol, N,N-dimethylethanolamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine and trilsopropanolamine; polyalkylenepolyamines, such as diethylenetriamine, triethylenetetramine, propylenediamine, N,N-diethylethylenediamine, 1,4-butanediamine, N-ethylethylenediamine, 1,2-propanediamine, 1,3-propanediamine and 1,6-hexanediamine; aliphatic amines, such as triethylamine, 2-ethyl-hexylamine, dioctylamine, tributylamine, tripropylamine, triallylamine, heptylamine and cyclohexylamine; aromatic amines, such as benzylamine and diphenylamine; and cyclic amines, such as piperazine, N-methyl-piperazine and hydroxyethylpiperazine. Preferred water-soluble amines are those having boiling points of 140° C. (760 mmHg) and above, as exemplified by monoethanolamine and triethanolamine.

If the water-soluble amine is to be added, it is preferably incorporated in an amount of about 0.1–30 mass %, more preferably about 2–15 mass %, of the over-coating agent (in terms of solids content). If the water-soluble amine is incorporated in an amount of less than 0.1 mass %, the coating fluid may deteriorate over time. If the water-soluble amine is incorporated in an amount exceeding 30 mass %, the photoresist pattern being formed may deteriorate in shape.

For such purposes as reducing the dimensions of patterns and controlling the occurrence of defects, the over-coating agent for forming fine patterns may further optionally contain non-amine based, water-soluble organic solvents.

As such non-amine based, water-soluble organic solvents, any non-amine based organic solvents that can mix with water may be employed and they may be exemplified by the following: sulfoxides, such as dimethyl sulfoxide; sulfones, such as dimethylsulfone, diethylsulfone, bis(2-hydroxyethyl) sulfone and tetramethylenesulfone; amides, such as N,N-dimethylformamide, N-methylformamide, N,N-dimethylacetamide, N-methylacetamine and N,N-diethylacetamide; lactams, such as N-methyl-2-pyrrolidone, N-ethyl-2-pyrrolidone, N-propyl-2-pyrrolidone, N-hydroxymethyl-2-pyrrolidone and N-hydroxyethyl-2-pyrrolidone; imidazolidinones, such as 1,3-dimethyl-2-imidazolidinone, 1,3-diethyl-2-imidazolidinone and 1,3-diisopropyl-2-imidazolidinone; and polyhydric alcohols and derivatives thereof, such as ethylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether, diethylene glycol monobutyl ether, propylene glycol, propylene glycol monomethyl ether, glycerol, 1,2-butylene glycol, 1,3-butylene glycol and 2,3-butylene glycol. Among those mentioned above, polyhydric alcohols and their derivatives are preferred for the purposes of reducing the dimensions of patterns and controlling the occurrence of defects and glycerol is particularly preferred. The non-amine based, water-soluble organic solvents may be used either singly or in combination.

If the non-amine based, water-soluble organic solvent is to be added, it is preferably incorporated in an amount of about 0.1–30 mass %, more preferably about 0.5–15 mass %, of the water-soluble polymer. If the non-amine based, water-soluble organic solvent is incorporated in an amount of less than 0.1 mass %, its defect reducing effect tends to decrease. Beyond 30 mass %, a mixing layer is liable to form at the interface with the photoresist pattern.

In addition, the over-coating agent may optionally contain a surfactant for attaining special effects such as coating uniformity and wafer's in-plane uniformity.

The surfactant is preferably employed that, when added to the water-soluble polymer, exhibits certain characteristics such as high solubility, non-formation of a suspension and miscibility with the polymer component. By using surfactants that satisfy these characteristics, the occurecne of defects can be effectively controlled that is considered to be pertinent to microforming upon coating the over-coating agent.

Preferred suitable surfactant in the invention is at least one member selected among N-alkylpyrrolidones, quaternary ammonium salts and phosphate esters of polyoxyethylene.

N-alkylpyrrolidones as surfactant are preferably represented by the following general formula (I):

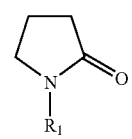

(I)

where $R_1$ is an alkyl group having at least 6 carbon atoms.

Specific examples of N-alkylpyrrolidones as surfactant include N-hexyl-2-pyrrolidone, N-heptyl-2-pyrrolidone, N-octyl-2-pyrrolidone, N-nonyl-2-pyrrolidone, N-decyl-2-pyrrolidone, N-undecyl-2-pyrrolidone, N-dodecyl-2-pyrrolidone, N-tridecyl-2-pyrrolidone, N-tetradecyl-2-pyrrolidone, N-pentadecyl-2-pyrrolidone, N-hexadecyl-2-pyrrolidone, N-heptadecyl-2-pyrrolidone and N-octadecyl-2-pyrrolidone. Among these, N-octyl-2-pyrrolidone ("SURFADONE LP 100" of ISP Inc.) is preferably used.

Quaternary ammonium salts as surfactant are preferably represented by the following general formula (II):

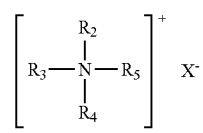

(II)

where $R_2$, $R_3$, $R_4$ and $R_5$ are each independently an alkyl group or a hydroxyalkyl group (provided that at least one of them is an alkyl or hydroxyalkyl group having not less than 6 carbon atoms); $X^-$ is a hydroxide ion or a halogenide ion.

Specific examples of quaternary ammonium salts as surfactant include dodecyltrimethylammonium hydroxide, tridecyltrimethylammonium hydroxide, tetradecyltrimethylammonium hydroxide, pentadecyltrimethylammonium hydroxide, hexadecyltrimethylammonium hydroxide, heptadecyltrimethylammonium hydroxide and octadecyltrimethylammonium hydroxide. Among these, hexadecyltrimethylammonium hydroxide is preferably used.

Phosphate esters of polyoxyethylene are preferably represented by the following general formula (III):

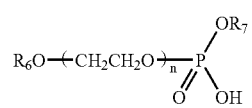

(III)

where $R_6$ is an alkyl or alkylaryl group having 1–10 carbon atoms; $R_7$ is a hydrogen atom or $(CH_2CH_2O)R_6$ (where $R_6$ is as defined above); n is an integer of 1–20.

To mention specific examples, phosphate esters of polyoxyethylene that can be used as surfactants are commercially available under trade names "PLYSURF A212E" and "PLYSURF A210G" from Dai-ichi Kogyo Seiyaku Co., Ltd.

The amount of the surfactant is preferably about 0.1–10 mass %, more preferably about 0.2–2 mass %, of the over-coating agent (in terms of solids content). By adopting the amount as described above ranges, it may effectively prevent the variations in the percent shrinkage of patterns, potentially depending on the wafer's in-plane uniformity which is caused by the deterioration of coating property, and also prevent the occurrence of defects that are considered to have cause-andeffect relations with microfoaming on the applied film that generates as the coating conditions are worsened.

The over-coating agent used in the invention for forming fine patterns is preferably used as an aqueous solution at a concentration of 3–50 mass %, more preferably at 5–30 mass %. If the concentration of the aqueous solution is less than 3 mass %, poor coverage of the substrate may result. If the concentration of the aqueous solution exceeds 50 mass %, there is no appreciable improvement in the intended effect that justifies the increased concentration and the solution cannot be handled efficiently.

As already mentioned, the over-coating agent of the invention for forming fine patterns is usually employed as an aqueous solution using water as the solvent. A mixed solvent system comprising water and an alcoholic solvent may also be employed. Exemplary alcoholic solvents are monohydric alcohols including methyl alcohol, ethyl alcohol, propyl alcohol and isopropyl alcohol. These alcoholic solvents are mixed with water in amounts not exceeding about 30 mass %.

[b.] Heat Treatment (Thermal Shrinkage) Step

In the next step, heat treatment is performed to cause thermal shrinkage of the film of the over-coating agent. Under the resulting force of thermal shrinkage of the film, the dimensions of the photoresist pattern in contact with the film will increase by an amount equivalent to the thermal shrinkage of the film and, as the result, the photoresist pattern widens and accordingly the spacing between adjacent photoresist patterns lessens. The spacing between adjacent photoresist patterns determines the diameter or width of the pattern elements to be finally obtained, so the decrease in the spacing between adjacent photoresist patterns contributes to reducing the diameter of each element of a hole pattern or the width of each element of a trench pattern, eventually leading to the definition of a pattern with smaller feature sizes.

The heating temperature is not limited to any particular value as long as it is high enough to cause thermal shrinkage of the film of the over-coating agent and form or define a fine pattern. Heating is preferably done at a temperature that will not cause thermal fluidizing of the photoresist pattern. The temperature that will not cause thermal fluidizing of the photoresist pattern is such a temperature that when a substrate on which the photoresist pattern has been formed but no film of the over-coating agent has been formed is heated, the photoresist pattern will not experience any dimensional changes. Performing a heat treatment under such temperature conditions is very effective for various reasons, e.g. a fine-line pattern of good profile can be formed more efficiently and the duty ratio in the plane of a wafer, or the dependency on the spacing between photoresist patterns in the plane of a wafer, can be reduced. Considering the softening points of a variety of photoresist compositions employed in current photolithographic techniques, the preferred heat treatment is usually performed within a temperature range of about 80–160° C. for 30–90 seconds, provided that the temperature is not high enough to cause thermal fluidizing of the photoresist.

The thickness of the film of the over-coating agent for the formation of fine-line patterns is preferably just comparable to the height of the photoresist pattern or high enough to cover it.

[d.] Over-Coating Agent Removal Step

In the subsequent step, the remaining film of the over-coating agent on the patterns is removed by washing with an aqueous solvent, preferably pure water, for 10–60 seconds. Prior to washing with water, rinsing may optionally be performed with an aqueous solution of alkali (e.g. tetramethylammonium hydroxide (TMAH) or choline). The over-coating agent in the present invention is easy to remove by washing with water and it can be completely removed from the substrate and the photoresist pattern.

As a result, each pattern on the substrate has a smaller feature size because each pattern is defined by the narrowed spacing between the adjacent widened photoresist patterns.

The fine-line pattern thus formed using the over-coating agent of the present invention has a pattern size smaller than the resolution limit attainable by the conventional methods. In addition, it has a good enough profile and physical properties that can fully satisfy the characteristics required of semiconductor devices.

Steps [a.]–[c.] may be repeated several times. By repeating steps [a.]–[c.] several times, the photoresist patterns (mask patterns) can be progressively widened. Since the over-coating agent employed contains a water-soluble polymer, the over-coating agent can be completely eliminated in each washing procedure even though water-washing is performed several times. Consequently, even in the case of using a substrate having a thick photoresist pattern film thereon, fineline patterns having favorable profile can be formed without causing pattern distortion or deformation.

The technical field of the present invention includes the fabrication of semiconductor devices, etc.

EXAMPLES

The following examples are provided for further illustrating the present invention but are in no way to be taken as limiting. Unless otherwise noted, all amounts of ingredients are expressed in mass %.

Example 1

A copolymer containing polyacrylate (PAA) and polyvinylpyrrolidone (PVP) [6.36 g; PAA:PVP=2:1 (polymerization ratio)], triethanolamine (0.57 g) and a polyoxyethyelene phosphate ester surfactant (0.07 g; "PLYSURF A210G", product of Dai-ichi Kogyo Seiyaku Co, Ltd.) were dissolved in water (93 g) to prepare an over-coating agent.

Separately, a photoresist being sensitive to electron beams was prepared by dissolving a copolymer containing polyhydroxystyrene and tert-butyl acrylate (10 g; 70:30 by polymerization ratio), perfluorosulfonium triphenylsulfate salt (1.0 g), tributylamine (0.009 g), salicylic acid (0.005 g) and a surfactant (0.006 g; "XR-104", product of Dainippon Ink & Chemicals Inc.) in ethyl lactate (89 g).

The photoresist was whirl coated on a substrate and baked at 140° C. for 90 seconds to form a photoresist layer in a thickness of 0.40 μm.

Next, the photoresist layer was subjected to an electron beam photolithography using an exposure unit "HL-800D" (product of Hitachi Instruments Service Co., Ltd.), heated at 130° C. for 90 seconds and developed with a 2.38 mass % aqueous solution of TMAH (tetramethylammonium hydroxide) to thereby form photoresist patterns. By forming the photoresist patterns, hole patterns of 100 nm in hole diameter were defined.

Next, the above-described over-coating agent was applied onto the substrate including hole patterns and subjected to heat treatment at 120° C. for 60 seconds, thereby reducing the each size of the hole patterns. Subsequently, the substrate was brought into contact with pure water at 23° C. to remove the over-coating agent. The each diameter of the hole patterns was reduced to 65 nm. None of the fine patterns showed any variations in pattern dimensions of 6.5 nm (i.e., ±10% of the diameter of the fine patterns) or more, and indicates the excellent in-plane uniformity.

Comparative Example 1

Using the photoresist prepared in EXAMPLE 1, the procedure of forming photoresist patterns as described in EXAMPLE 1 was followed, but omitting the subsequent treatment of forming fine patterns with the use of the over-coating agent. Thus, hole patterns of 100 nm in diameter were defined. In this case, variations in the pattern dimensions exceeding 10 nm (i.e., ±10% of the pattern size) arose in the plane, thus resulting in a fear of seriously lowering the yield.

As discussed above in detail, the present invention provides a method whereby fine patterns having pattern width or diameter of 100 nm or less and being excellent in uniformity (in-plane uniformity), etc. can be formed by ultrafine processing using high energy light rays with wavelength of 200 nm or shorter or electron beams.

What is claimed is:

1. A method for forming fine patterns comprising: covering a substrate having photoresist patterns thereon made of a photoresist composition which is sensitive to high energy light rays with wavelength of 200 nm or shorter or electron beam radiation, with an over-coating agent for forming fine patterns, applying heat treatment, wherein the heat treatment is performed at a temperature that does not cause thermal fluidizing of the photoresist patterns on the substrate, to cause thermal shrinkage of the over-coating agent so that the spacing between adjacent photoresist patterns is lessened by the resulting thermal shrinking action, thereby forming fine patterns having a pattern width or diameter of 100 nm or less, and removing the over-coating agent substantially completely.

2. The method of forming fine patterns according to claim 1, wherein the over-coating agent contains a water-soluble polymer.

3. The method of forming fine patterns according to claim 2, wherein the water-soluble polymer is at least one member selected from the group consisting of alkylene glycolic polymers, cellulosic derivatives, vinyl polymers, acrylic polymers, urea polymers, epoxy polymers, melamine polymers and amide polymers.

4. The method of forming fine patterns according to claim 1, wherein the over-coating agent is an aqueous solution having a solids content of 3–50 mass %.

5. The method for forming fine patterns according to claim 2, wherein the over-coating agent is an aqueous solution having a solids content of 3-50 mass%.

6. The method for forming fine patterns according to claim 3, wherein the over-coating agent is an aqueous solution having a solids content of 3-50 mass%.

7. The method for forming fine patterns according to claim 2 wherein the water-soluble polymer is a copolymer containing polyacrylate and polyvinypyrrolidone.

* * * * *